US012699330B2

(12) United States Patent
Ehm et al.

(10) Patent No.: US 12,699,330 B2
(45) Date of Patent: Aug. 4, 2026

(54) METHOD FOR DEPOSITING A COVER LAYER, EUV LITHOGRAPHY SYSTEM AND OPTICAL ELEMENT

(71) Applicant: Carl Zeiss SMT GmbH, Oberkochen (DE)

(72) Inventors: Dirk Ehm, Beckingen (DE); Moritz Becker, Aalen (DE); Stefan Schmidt, Mettlach (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 18 days.

(21) Appl. No.: 18/665,818

(22) Filed: May 16, 2024

(65) Prior Publication Data

US 2024/0302756 A1 Sep. 12, 2024

Related U.S. Application Data

(63) Continuation of application No. PCT/EP2022/079099, filed on Oct. 19, 2022.

(30) Foreign Application Priority Data

Nov. 16, 2021 (DE) ..................... 10 2021 212 874.2

(51) Int. Cl.
*G03F 7/00* (2006.01)
*G02B 1/14* (2015.01)

(52) U.S. Cl.
CPC ...... *G03F 7/70958* (2013.01); *G03F 7/70033* (2013.01); *G03F 7/7015* (2013.01);
(Continued)

(58) Field of Classification Search
CPC . C23C 16/45555; G02B 1/14; G03F 7/70033; G03F 7/7015; G03F 7/702;
(Continued)

(56) References Cited

U.S. PATENT DOCUMENTS 8,382,301 B2 2/2013 Ehm et al.
8,585,224 B2 11/2013 Ehm et al.
(Continued)

FOREIGN PATENT DOCUMENTS

CN 106646701 A * 5/2017 ........... G02B 5/0808
DE 10235255 A1 2/2004
(Continued)

OTHER PUBLICATIONS

Translation of DE 102006042987 A1, Apr. 3, 2008.*
(Continued)

*Primary Examiner* — Peter B Kim
(74) *Attorney, Agent, or Firm* — Edell, Shapiro & Finnan, LLC

(57) ABSTRACT

A method of depositing a cover layer onto an optical element (M1) for reflection of EUV radiation. In the method, a cover layer containing phosphorus (P) is deposited onto the optical element (M1). The optical element (M1) in the course of deposition of the cover layer (35) is disposed in an interior (39) of a housing (36) of an EUV lithography system, and, for the deposition of the cover layer, phosphorus (P) is released from at least one phosphorus source (42, 43) disposed outside the interior (39) or within the interior (39). Also disclosed are an EUV lithography system and an optical element (M1) for reflecting EUV radiation.

21 Claims, 3 Drawing Sheets

(52) U.S. Cl.
CPC .......... *G03F 7/702* (2013.01); *G03F 7/70233* (2013.01); *G03F 7/70316* (2013.01); *G03F 7/70925* (2013.01); *G03F 7/70933* (2013.01); *G02B 1/14* (2015.01)

(58) Field of Classification Search
CPC ............. G03F 7/70233; G03F 7/70316; G03F 7/70925; G03F 7/70933; G03F 7/70958; G03F 7/70983
See application file for complete search history.

(56) References Cited

U.S. PATENT DOCUMENTS

| | | | |
|---|---|---|---|
| 2004/0030814 | A1 | 2/2004 | Kamm et al. |
| 2007/0040999 | A1 | 2/2007 | Wilhelmus Van Herpen et al. |
| 2009/0074962 | A1 | 3/2009 | Wilhelmus Van Herpen et al. |
| 2010/0288302 | A1 | 11/2010 | Ehm et al. |
| 2011/0228243 | A1 | 9/2011 | Banine et al. |

FOREIGN PATENT DOCUMENTS

| | | | |
|---|---|---|---|
| DE | 102006042987 | A1 | 4/2008 |
| DE | 102006042987 | B4 | 1/2012 |
| DE | 102017213172 | A1 | 9/2017 |
| DE | 102018218281 | A1 | 12/2018 |
| DE | 102021200130 | A1 | 7/2022 |
| DE | 102021210101 | A1 | 3/2023 |
| WO | 2009059614 | A1 | 5/2009 |
| WO | 2011020623 | A1 | 2/2011 |
| WO | 2022148742 | A1 | 7/2022 |
| WO | 2023041213 | A1 | 3/2023 |

OTHER PUBLICATIONS

International Search Report, PCT/EP2022/079099, Feb. 6, 2023, 6 pages.
German Office Action with English translation, Application No. 10 2021 212 874.2, Apr. 19, 2022, 5 pages.

* cited by examiner

METHOD FOR DEPOSITING A COVER LAYER, EUV LITHOGRAPHY SYSTEM AND OPTICAL ELEMENT

CROSS-REFERENCE TO RELATED APPLICATION

This is a Continuation of International Application PCT/EP2022/079099, which has an international filing date of Oct. 19, 2022, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2021 212 874.2 filed on Nov. 16, 2021.

FIELD OF THE INVENTION

The invention relates to a method of depositing a cover layer onto an optical element for reflection of EUV radiation, to an EUV lithography system and to an optical element for reflection of EUV radiation that has a reflective coating and a cover layer applied to the reflective coating.

BACKGROUND

For the purposes of this application, an EUV lithography system is understood to mean an optical system that can be used in the field of extreme ultraviolet (EUV) lithography. In addition to a projection exposure apparatus for EUV lithography which serves for production of semiconductor components, the EUV lithography system may, for example, be an inspection system for inspection of a photomask used in such a projection exposure apparatus (also referred to hereinafter as reticle), for inspection of a semiconductor substrate to be structured (also referred to hereinafter as wafer), or a metrology system which is used for measurement of a projection exposure apparatus for EUV lithography or parts thereof, for example for measurement of a projection optical unit.

In EUV lithography systems, hydrogen is generally used as purge gas. The interaction of hydrogen with EUV radiation forms a hydrogen plasma, in particular in the form of hydrogen ions and/or free hydrogen radicals. The hydrogen ions and/or free hydrogen radicals react with components present in the vacuum environment within the EUV lithography system that contain materials in the form of what are called HIO (hydrogen induced outgassing) elements. The HIO elements form gaseous contaminations in the form of volatile hydrides in the reaction with hydrogen plasma, which are also referred to as HIO products. The HIO products may in particular be deposited on the surfaces of optical elements for reflection of EUV radiation in the form of EUV mirrors, for example on a protective layer composed of a metal, for example of ruthenium. The accumulation of the HIO products, in particular in the form of a homogeneous contamination layer atop such a protective layer, generally results in a considerable loss of reflectivity of the respective EUV mirror.

The most common HIO elements in an EUV lithography system are Sn, Zn, Si, P, Mg and F. It has been found experimentally that the deposition rate on the surfaces of the EUV mirrors is subject to a saturation process that can be described by an equilibrium state between the deposition of HIO products and HIO cleaning, i.e. the detachment of HIO products. It has also been found that the deposition of HIO products is at its greatest on metallic surfaces or on metallic materials, for example on the metallic protective layer described further above. Because of its catalytic behavior, this is especially true of ruthenium, which is frequently used as a protective layer in EUV mirrors.

DE102018218281A1 describes an optical arrangement for EUV radiation that has at least one reflective optical element having a main body having a coating that reflects EUV radiation and a stop spaced apart from a surface region to be protected on the main body. The stop is releasably secured on a carrier which is permanently bonded to a mechanical component of the optical arrangement.

As well as the measures described further above of removing HIO elements, of shielding optical elements from the HIO products and of binding the HIO products, it is known that cover layers can be applied to the EUV mirrors that are stable to the deposition of HIO products and are intended to prevent the accumulation of HIO products.

WO2011020623A1 describes a reflective optical element for the EUV wavelength range comprising a reflective face having an uppermost layer. The uppermost layer includes one or more organic silicon compounds. The optical element may have a layer of ruthenium and/or of silicon nitride beneath the uppermost layer. A method of producing such a reflective optical element comprises the following steps: introducing a reflective optical element having a reflective face into a chamber; introducing a gas containing one or more organic silicon compounds; and contacting the reflective face with electromagnetic radiation and/or with charged particles. The chamber used may be a coating chamber or a chamber of an EUV lithography apparatus.

DE102017213172A1 describes a method of applying a cover layer to a reflective coating of an optical element for reflection of EUV radiation by atomic layer deposition. The cover layer may be applied to a protective layer including at least one metal, for example a precious metal, e.g. Ru. The cover layer may include carbon, silicon, tin, titanium and/or zirconium. The cover layer may include silicon in the form of an oxide, a nitride, a carbide, an oxynitride and/or in the form of an oxycarbide.

When the cover layers described further above are used, and in the case of other cover layers containing oxygen, for example in the case of $ZrO_2/NbO_2$ cover layers, the problem exists that, because of the high effective absorption cross sections of oxygen, the deposited cover layer results in a loss of reflectivity, considerable in some cases, of the EUV mirror.

SUMMARY

It is an object of the invention to specify a method of depositing a cover layer that counteracts the accumulation of contaminating substances without causing a considerable loss of reflectivity, and an EUV lithography system and an optical element having such a cover layer.

This object is achieved, according to one formulation, by a method of the type specified above, comprising: depositing a cover layer containing phosphorus onto the optical element.

A cover layer in the context of this application is understood to mean the uppermost layer of a coating applied to the reflective optical element. The cover layer has a surface that forms an interface with the environment of the optical element, for example an EUV mirror.

In this aspect of the invention, it is proposed that the accumulation of HIO products at the surface of the optical element be counteracted by the deposition of a stable, phosphorus-containing cover layer. As described further above, phosphorus in itself is an HIO element, the accumulation of which at the surface of an optical element should be fundamentally avoided. However, it has been found that the deposition of a thin cover layer consisting of elemental phosphorus or containing elemental phosphorus only very slightly reduces the reflectivity of the optical element, specifically in the order of magnitude of about 0.25% per nanometer of thickness of the cover layer based on the reflectivity of the optical element without the applied cover layer.

The loss of reflectivity in the accumulation of phosphorus at the surface is thus lower than the loss of reflectivity that arises from the accumulation of other HIO elements at the surface of the optical element. However, the loss of reflectivity is also lower than the loss of reflectivity which is caused in the deposition, described in WO2011/020623 A1, of a cover layer of silicon or of $SiO_2$ in the chemically reduced state. The reduced (elemental) state of phosphorus in the cover layer is rapidly attained in operation of the EUV lithography system even if an oxide, e.g. $P_2O_5$, may be formed at first when the EUV lithography system is ventilated.

Another reason why the deposition of a phosphorus-containing cover layer is favorable is because experiments have shown that an elemental phosphorus-containing cover layer prevents or at least slows the accumulation of other HIO products at the surface of the cover layer, and hence prevents or at least limits the greater loss of reflectivity of the optical element caused by the accumulation of these HIO products. For example, it has been observed experimentally that the accumulation of Si or of Mg is limited by the presence of P at the surface of the optical element, and vice versa. The presence of a large amount of phosphorus at the surface of the cover layer or in the cover layer can therefore counteract the accumulation of silicon and other HIO elements, e.g. Mg.

In one variant, the phosphorus-containing cover layer has a phosphorus content of at least 95 at %, preferably of at least 98 at %. As described further above, phosphorus and other HIO products accumulate at the surfaces of the reflective optical elements in operation of an EUV lithography system, for example in exposure operation of an EUV lithography apparatus. However, the accumulation of phosphorus and other HIO products typically proceeds under uncontrolled conditions, which leads to formation of a cover layer in the form of a mixed contamination layer that contains different HIO products or HIO elements and therefore leads to a considerable loss of reflectivity (see above). For example, a chemical analysis of the surfaces of EUV mirrors after use thereof in operation of an EUV lithography apparatus showed that, as well as P, for example, Sn, Zn, Mg, C and $SiO_2$ have also accumulated at the surface. The controlled deposition of a cover layer having the high phosphorus content described further above counteracts the accumulation of other HIO elements and hence the formation of such a contamination layer including multiple HIO elements.

In a further variant, the cover layer has a thickness of between 0.3 nm and 5 nm, preferably between 0.3 nm and 2.5 nm. As described further above, the loss of reflectivity per nm of thickness of the cover layer is comparatively small and is about 0.25% per nm, based on the reflectivity without the presence of the cover layer. An cover layer containing only elemental phosphorus and having a thickness of 2.5 nm therefore causes a loss of reflectivity in the order of magnitude of about 0.65%, which can still be tolerated. It may be the case that the thickness of the cover layer is even greater and is, for example, 5 nm or higher. It will be apparent that the thickness of the cover layer should not be less than a minimum, in order to ensure complete coverage of the surface with the cover layer in the order of magnitude of a monolayer. An cover layer having the above-specified thickness can be deposited, for example, by atomic layer deposition as described in DE102017213172A1, cited at the outset, which is incorporated into this application in its entirety by reference.

In a further variant, the cover layer is deposited onto a protective layer including at least one metal, preferably at least one precious metal, in particular Ru. The metallic protective layer may in particular be a ruthenium layer which, because of its catalytic action, is particularly prone to the accumulation of HIO elements. In the case of an EUV mirror for normal incidence, the protective layer or, as the case may be, a protective layer system having multiple protective layers is applied to a reflective coating that typically has a multitude of alternating layers having alternately high and low real parts of the refractive index. The material of the layers depends on the operating wavelength of the EUV lithography system. At an operating wavelength of 13.5 nm, the materials are typically Si and Mo.

In one variant, the optical element on deposition of the cover layer is disposed within an interior of a housing of an EUV lithography system. In this variant, the deposition of the cover layer is conducted in situ, i.e. on an optical element integrated within the EUV lithography system. Such in situ deposition of a phosphorus cover layer is possible not just in the case of new EUV lithography systems, but also in the case of those already in operation or in the field. In situ deposition is an emergency solution for protection of all optical elements from a severe loss of reflectivity as a result of significantly more dominant HIO-based degradation by HIO products other than phosphorus. This emergency solution is advantageous when such HIO-based degradation is identified after mirror coating has concluded.

The housing in which the optical element is disposed may, for example, be a housing of any EUV light source, a housing of an illumination system or a housing of a projection system of an EUV lithography system in the form of an EUV lithography apparatus. The housing may alternatively be a casing that surrounds the beam path of the EUV lithography apparatus in order to keep contaminating substances away from the surfaces of the optical elements as far as possible, or a main housing of the EUV lithography apparatus into which the other housings are integrated.

It has been found experimentally that phosphorus contamination at the surfaces of EUV mirrors is attributable essentially to phosphorus-containing residues from cleaning media on the frame of the illumination system of an EUV lithography system. These cleaning residues are released in operation of the EUV lithography system in interaction with the EUV-induced hydrogen plasma and, in a typical HIO process, are transferred to the surface of the reflective optical elements. It has likewise been found that phosphorus contamination on the frame of the illumination system is subject to a rapid degradation process, and so it is not the case that the same amount of phosphorus is deposited on all reflective optical elements. In general, more phosphorus accumulates on the reflective optical elements of the illumination system than on the reflective optical elements of the projection system. However, the amount accumulated is typically insufficient to prevent the accumulation of other HIO products.

For a minimum loss of reflectivity, however, it is favorable or necessary for the cover layer deposited in situ to have a maximum phosphorus content within the range of values specified further above. Such a high phosphorus content of the cover layer is not established automatically in the case of a conventional EUV lithography system; instead, it is necessary to take measures that enable specific in situ deposition of the phosphorus-containing cover layer.

In one variant, for deposition of the cover layer, at least one gas containing phosphorus is fed to the interior via at least one gas inlet. The phosphorus-containing gas which is supplied to the interior is typically deposited on the surface of the optical element in the form of an cover layer without necessarily requiring additional measures, for example the generation of a (hydrogen) plasma. The supply of the phosphorus-containing gas via the gas inlet can be maintained over a defined period (deposition time) until a stable phosphorus cover layer has formed on the surface. The amount or mass flow of the phosphorus-containing gas can be controlled here by open-loop or, as the case may be, closed-loop control in order to deposit a cover layer having the desired thickness. It is possible to feed in the phosphorus-containing gas when EUV radiation is present in the EUV lithography system, as is the case, for example, in exposure operation, but it is also possible to feed in the phosphorus-containing gas in a break in operation in which there is no EUV radiation in the interior. The phosphorus may be present in the gas in the form of virtually any volatile phosphorus compound, for example in the form of phosphine ($PH_3$).

In one development of this variant, the phosphorus-containing gas is admixed with at least one purge gas, in particular molecular hydrogen, before the phosphorus-containing gas is fed into the interior via the at least one gas inlet. In this variant, the phosphorus-containing gas is mixed with a purge gas, typically with hydrogen, and the mixture is fed to the interior. In this case, the phosphorus-containing gas is typically fed in in a global manner, i.e. for the entire EUV lithography system, and the phosphorus-containing gas is distributed throughout the EUV lithography system together with the purge gas. In this way, particularly simple feeding of the phosphorus-containing gas is enabled without having to modify the EUV lithography system. The proportion or partial pressure of the phosphorus-containing gas in the gas mixture is generally distinctly smaller compared to the partial hydrogen pressure. The partial hydrogen pressure in the interior is typically about $10^{-2}$ mbar.

In a further development of this variant, the phosphorus fed in has a partial pressure in the interior of at least $10^{-6}$ mbar, preferably of at least $10^{-3}$ mbar. At a partial phosphorus pressure of $10^{-6}$ mbar, the growth of a monolayer of phosphorus takes about 1 second. At correspondingly higher partial pressures, there is rapid saturation of the surface with the phosphorus cover layer.

Alternatively or additionally to the admixing with a purge gas as described further above, it is possible to arrange multiple gas inlets for supply of the phosphorus-containing gas at different positions within the EUV lithography system. Typically, a respective gas inlet is disposed in the vicinity of a respective reflective optical element or group of reflective optical elements on the surface of which the cover layer is to be deposited.

In a further variant, deposition of the cover layer from at least one phosphorus source disposed outside the interior or within the interior, preferably disposed close to the surface of the optical element, is accomplished by release or outgassing of phosphorus. As described further above, in general, there are phosphorus-outgassing components in an EUV lithography apparatus, but the amount of phosphorus which is outgassed by these components is insufficient to deposit a cover layer of phosphorus on the optical elements; what is instead formed is generally the contamination layer containing multiple different HIO elements as described further above. The phosphorus source accordingly includes an amount of phosphorus sufficiently large for the reservoir of phosphorus not to be exhausted during the lifetime of the EUV lithography system even when a phosphorus-containing cover layer is repeatedly deposited on the surface of a respective optical element.

The phosphorus source preferably has at least one surface having a phosphorus content of at least 95 at %, in particular of at least 98 at %. It is favorable when the phosphorus source provides the phosphorus with a high purity in order to prevent the outgassing of other contaminating substances into the interior. Typically, the size of the phosphorus source is matched to the site where it is positioned or to the plasma conditions that prevail at that site.

The phosphorus source may in particular be a component to which a phosphorus coating is applied, which typically has a phosphorus content within the range of values described above. The thickness of such a phosphorus coating is generally comparatively high and should ideally be more than 1 mm.

The component to which the phosphorus coating is applied may in principle be configured as desired. Since there is generally a shortage of build space in EUV lithography apparatuses, the component may be in sheetlike form, for example in the form of a sheet or the like, to which the phosphorus coating is applied. The sheet may be matched to the build space available, i.e. suitably shaped or curved.

The phosphorus source may be disposed, for example, in a main chamber of a main housing of the EUV lithography system, in which the housings of the EUV light source, the illumination system and the projection system are disposed. The (at least one) phosphorus source may in this case be positioned, for example, at a respective inlet position or at an opening at the transition between the housing of the EUV light source and the housing of the illumination system (intermediate focus), close to a reticle holder at the transition between the housing of the illumination system and the housing of the projection system, or close to the wafer holder at the outlet of the housing of the projection system. It is also possible that the phosphorus source is positioned at a dynamic gas lock of the EUV lithography system.

In particular, the dedicated arrangement of one or more phosphorus sources close to a respective optical element can result in deposition of an cover layer having the high phosphorus content described further above. The expression "close to the surface" in the context of this application is understood to mean a distance of less than 5 cm, preferably less than 2 cm, between the phosphorus-releasing phosphorus source and the surface of the optical element on which the cover layer is to be deposited. In particular, one or more phosphorus sources may be disposed on the optical element, for example adjacent to the surface on which the cover layer is deposited. Ideally, one or more separate phosphorus sources are mounted on each individual mirror such that homogeneous deposition on the respective mirror is assured.

In a further variant, the phosphorus is released by exposing the phosphorus source to a hydrogen plasma which is generated in operation, preferably in exposure operation, of the EUV lithography system. The phosphorus is typically released from the phosphorus source only by the action of a hydrogen plasma which is formed during the operation of the EUV lithography system because of the interaction of the EUV radiation with the purge gas present in the interior, generally with hydrogen. The release of the phosphorus from the phosphorus source may in principle be continuous without deposition of a cover layer having too great a thickness because, in operation of the EUV lithography system, a carbon-containing contamination layer will generally be deposited on the surface, on which the phosphorus will accumulate to a lesser degree, if at all, than on the generally metallic protective layer. When the carbon contamination layer has been removed (see below), the phosphorus atoms can be deposited on the surface. The deposition of the cover layer of phosphorus is therefore a self-terminating process, meaning that, over and above a particular thickness of the phosphorus cover layer, a dynamic equilibrium is established between the deposition of phosphorus and phosphorus cleaning, by which the phosphorus is removed again from the surface. In order to deposit the phosphorus-containing cover layer, it is typically necessary to remove the carbon-containing contamination layer from the surface of the optical element (see above).

In a further variant, the method comprises: removing a carbon contamination layer from a surface of the optical element prior to the deposition of the cover layer. Prior to the deposition of the cover layer, it is typically necessary to undertake cleaning of the optical element to remove a native carbon contamination layer from the surface of the optical element. The carbon cover layer or carbon contamination layer can be removed in different ways:

In one variant, the carbon contamination layer is removed from the surface by a hydrogen plasma generated in operation, in particular in exposure operation, of the EUV lithography system. As described further above, the hydrogen plasma generated in exposure operation can clean a respective optical element or all optical elements of the EUV lithography system in that the carbon contamination layer is removed by a plasma cleaning operation. The hydrogen plasma may also serve to deposit the phosphorus-containing cover layer on the surface of the optical element in that phosphorus is released from the at least one phosphorus source. As described further above, the deposition of the phosphorus cover layer is a self-terminating process in which a dynamic equilibrium is established at a particular thickness of the phosphorus cover layer. The thickness of the cover layer at which the equilibrium is established depends upon factors including the amount of phosphorus available in the environment of the optical element and can be influenced by the size of the respective phosphorus source (s).

In a further variant, the carbon contamination layer is removed from the surface of the optical element by at least one cleaning head that preferably generates a hydrogen plasma. The cleaning head may be designed, for example, in the manner described in WO 2009/059614 A1, which is incorporated into this application by reference. The cleaning head may, for example, have a heated filament along which molecular hydrogen is run in order to create the hydrogen plasma or atomic hydrogen in the form of free hydrogen radicals and/or hydrogen ions. The cleaning head may be disposed outside the beam path and may have an exit opening aligned to the surface of the optical element to be cleaned.

As an alternative to the deposition of the phosphorus-containing cover layer on an optical element disposed in the EUV lithography system, the cover layer can also be deposited prior to the installation of the optical element into the EUV lithography system. In this case, the optical element may be introduced, for example, into a coating chamber of a coating system as described in WO2011020623A1, cited at the outset, which is incorporated into this application in its entirety by reference. The cover layer can be deposited, for example, by atomic layer deposition, as is the case in DE102017213172A1, cited at the outset. In particular in the case of deposition of the cover layer prior to the integration of the optical element into an EUV lithography system, the thickness of the cover layer is known in advance, and so the design of the reflective coating, i.e. the thickness of the individual layers, in particular the thickness of the uppermost layer of the reflective coating, can be optimized for the attainment of maximum reflectivity of the optical element after the phosphorus-containing cover layer has been deposited.

A further aspect of the invention relates to an EUV lithography system comprising: a housing, at least one optical element for reflection of EUV radiation, disposed within an interior of the housing, at least one phosphorus source for release of phosphorus and/or at least one gas inlet designed to feed phosphorus into the interior of the housing, in order to deposit a cover layer containing phosphorus on the optical element. As described further above, the EUV lithography system may be an EUV lithography apparatus for exposure of a wafer, or may be some other optical arrangement that uses EUV radiation, for example an EUV inspection system, for example for inspection of masks, wafers or the like that are used in EUV lithography.

The gas inlet may have or be connected to a gas reservoir comprising the phosphorus-containing gas. As described further above in connection with the method, supply of the phosphorus-containing gas is generally required only during the duration of deposition of the cover layer. The gas inlet or gas feed therefore typically has at least one actuatable valve in order to either permit or block the supply of the phosphorus-containing gas to the interior. It is likewise possible, as the case may be, with the aid of the controllable valve, for example in the form of a mass flow controller, to control the mass flow rate of the phosphorus-containing gas into the interior under open-loop or, as the case may be, closed-loop control. For the actuation of the gas inlet or valve, the EUV lithography system typically has a control device.

As described further above, the gas inlet may be an inlet for the purge gas, typically for hydrogen. In this case, the EUV lithography apparatus may have a mixing device in order to mix the phosphorus-containing gas with the purge gas. It is alternatively possible to assign a dedicated gas inlet to each of the optical elements or groups of optical elements and to dispose them in the vicinity of the respective optical elements. In that case, with the aid of a multitude of valves, it is possible to individually control the supply of the phosphorus-containing gas to different optical elements. The gas inlets here may in particular be connected to one and the same reservoir for the phosphorus-containing gas.

As likewise described further above, the at least one phosphorus source may be disposed outside the interior of the housing or within the interior, preferably close to the surface of the optical element. If the phosphorus source is disposed outside the housing, this is typically disposed at an inlet position in which there is an opening with a gas flow into a respective housing in the interior of which the optical element is disposed.

A further aspect of the invention relates to an optical element of the type specified at the outset, in which the cover layer contains phosphorus, where the cover layer preferably has a phosphorus content of at least 95 at %, in particular of at least 98 at %. As described further above, the phosphorus-containing cover layer can prevent or at least reduce the accumulation of other HIO elements on the optical element.

In one embodiment, the optical element comprises a protective layer that is applied to the reflective coating and includes at least one metal, preferably at least one precious metal, in particular ruthenium, where the cover layer is applied to the protective layer. A metallic protective layer, in particular a protective layer of ruthenium, is particularly prone to the deposition of HIO products and can be effectively protected by the phosphorus-containing cover layer from the accumulation of other HIO products or HIO elements other than phosphorus.

In a further embodiment, the cover layer has a thickness of between 0.3 nm and 5 nm, preferably between 0.3 nm and 2.5 nm. The cover layer should on the one hand have sufficient thickness to fully cover the surface beneath and on the other hand not exceed a maximum thickness in order that the reflection loss is not too great.

Further features and advantages of the invention will be apparent from the description of working examples of the invention that follows, with reference to the figures of the drawing, which show details salient to the invention, and from the claims. The individual features can each be implemented individually or together in any combination in a variant of the invention.

BRIEF DESCRIPTION OF THE DRAWINGS

Exemplary working examples are shown in the schematic drawing and are elucidated in the description which follows. The figures show.

DETAILED DESCRIPTION

In the description of the drawings that follows, identical reference signs are used for components that are the same or have the same function.

Figure 1:
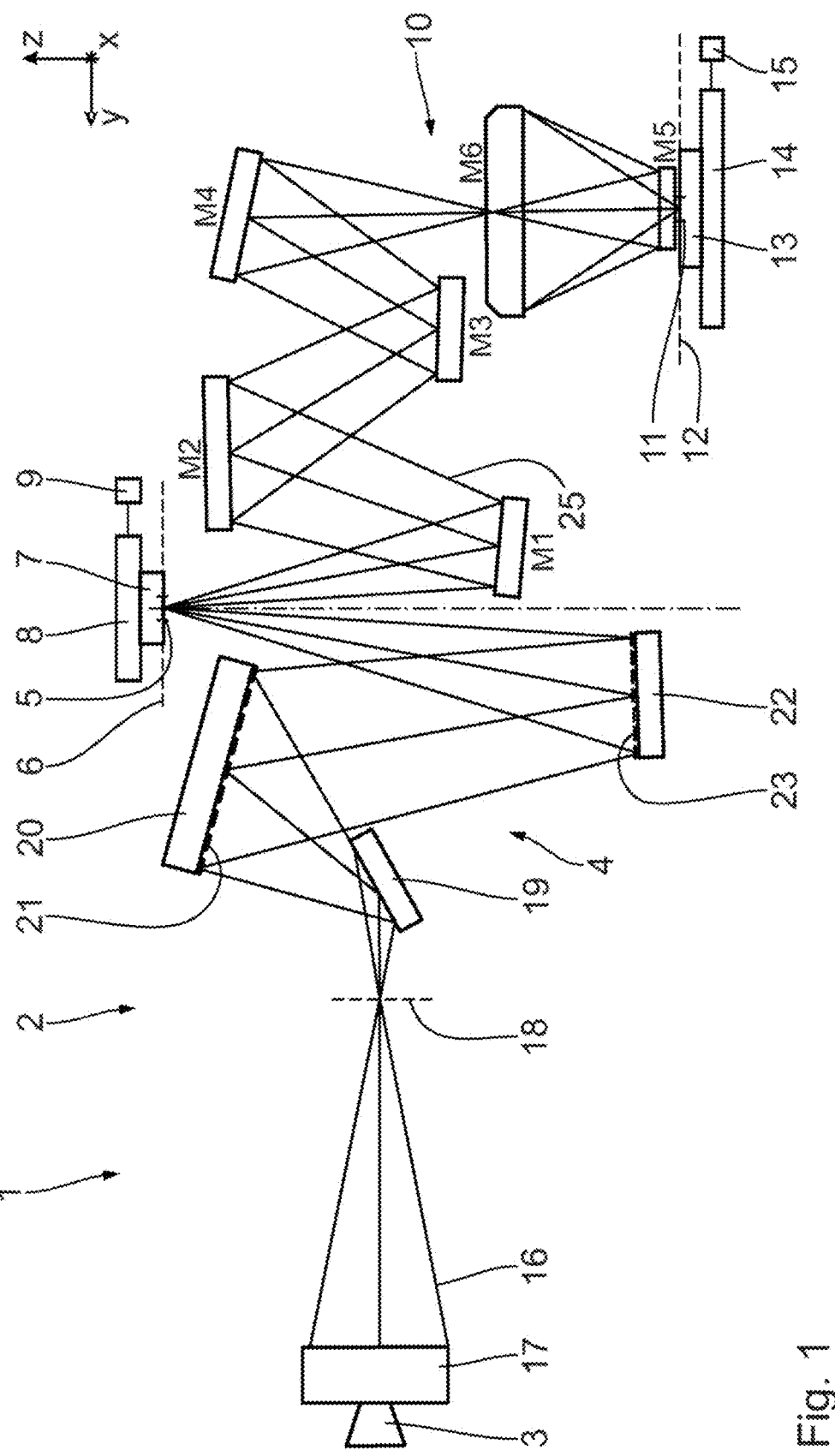
FIG. 1 a schematic meridional section through a projection exposure apparatus for EUV projection lithography, FIG. 2 a schematic diagram of a process of deposition of HIO products on a mirror of the projection exposure apparatus of FIG. 1, FIG. 3 a schematic diagram of a cross section through the uppermost layers of the mirror of FIG. 2 with a cover layer consisting of phosphorus, FIG. 4 a schematic diagram of the reflectivity of a mirror with a protective Ru layer, without or with a cover layer of $ZrO_2$, FIG. 5 a diagram that shows the proportion of the HIO elements Si, P and Mg at the surfaces of a multitude of mirrors that have been used in the projection exposure apparatus of FIG. 1, and FIG. 6 a schematic diagram of a detail of the projection exposure apparatus of FIG. 1 with phosphorus sources and with a gas feed for supply of a phosphorus-containing gas to the interior of a housing.

There follows a description with reference to FIG. 1 of primary constituents of an optical arrangement for EUV lithography in the form of a projection exposure apparatus 1 for microlithography. The description of the basic setup of the projection exposure apparatus 1 and the components thereof should not be considered here to be restrictive.

One embodiment of an illumination system 2 of the projection exposure apparatus 1, in addition to a light or radiation source 3, has an illumination optical unit 4 for illuminating an object field 5 in an object plane 6. In an alternative embodiment, the light source 3 may also be provided in the form of a module separate from the rest of the illumination system. In this case, the illumination system does not include the light source 3.

A reticle 7 arranged in the object field 5 is illuminated. The reticle 7 is held by a reticle holder 8. The reticle holder 8 is displaceable by way of a reticle displacement drive 9, in particular in a scanning direction.

By way of elucidation, FIG. 1 shows a Cartesian xyz coordinate system. The x direction runs perpendicularly to the plane of the drawing. The y direction runs horizontally, and the z direction runs vertically. The scanning direction runs in the y direction in FIG. 1. The z direction runs perpendicularly to the object plane 6.

The projection exposure apparatus 1 comprises a projection system 10. The projection system 10 is used to image the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable, in particular in the y direction, by way of a wafer displacement drive 15. The displacement of the reticle 7 on the one hand by way of the reticle displacement drive 9 and of the wafer 13 on the other hand by way of the wafer displacement drive 15 may be synchronized.

The radiation source 3 is an EUV radiation source. The radiation source 3 emits, in particular, EUV radiation 16, which is also referred to below as used radiation, illumination radiation or illumination light. In particular, the used radiation has a wavelength in the range between 5 nm and 30 nm. The radiation source 3 may be a plasma source, for example an LPP source (Laser Produced Plasma) or a GDPP source (Gas Discharge Produced Plasma). It may also be a synchrotron-based radiation source. The radiation source 3 can be a free electron laser (FEL).

The illumination radiation 16 emanating from the radiation source 3 is focused by a collector mirror 17. The collector mirror 17 may be a collector mirror with one or more ellipsoidal and/or hyperboloidal reflection surfaces. The illumination radiation 16 may be incident on the at least one reflection surface of the collector mirror 17 with grazing incidence (GI), i.e. at angles of incidence of greater than 45°, or with normal incidence (NI), i.e. at angles of incidence of less than 45°. The collector mirror 17 may be structured and/or coated, firstly to optimize its reflectivity for the used radiation and secondly to suppress extraneous light.

The illumination radiation 16 propagates through an intermediate focus in an intermediate focal plane 18 downstream of the collector mirror 17. The intermediate focal plane 18 may constitute a separation between a radiation source module, comprising the radiation source 3 and the collector mirror 17, and the illumination optical unit 4.

The illumination optical unit 4 comprises a deflection mirror 19 and, downstream thereof in the beam path, a first facet mirror 20. The deflection mirror 19 may be a plane deflection mirror or, alternatively, a mirror with a beam-influencing effect that goes beyond the pure deflection effect. As an alternative or in addition, the deflection mirror 19 may be designed as a spectral filter that separates a used light wavelength of the illumination radiation 16 from extraneous light at a different wavelength. The first facet mirror 20 comprises a plurality of individual first facets 21, which are also referred to below as field facets. FIG. 1 depicts only some of said facets 21 by way of example. In the beam path of the illumination optical unit 4, a second facet mirror 22 is disposed downstream of the first facet mirror 20. The second facet mirror 22 comprises a plurality of second facets 23.

The illumination optical unit 4 thus forms a double-faceted system. This fundamental principle is also referred to as a fly's eye integrator. The individual first facets 21 are imaged into the object field 5 with the aid of the second facet mirror 22. The second facet mirror 22 is the last beam-shaping mirror or indeed the last mirror for the illumination radiation 16 in the beam path upstream of the object field 5.

The projection system 10 comprises a plurality of mirrors Mi, which are consecutively numbered in accordance with their arrangement in the beam path of the projection exposure apparatus 1.

In the example illustrated in FIG. 1, the projection system 10 comprises six mirrors M1 to M6. Alternatives with four, eight, ten, twelve or any other number of mirrors Mi are likewise possible. The second-last mirror M5 and the last mirror M6 each have a passage opening for the illumination radiation 16. The projection system 10 is a doubly obscured optical unit. The projection optical unit 10 has an image-side numerical aperture that is greater than 0.4 or 0.5 and may also be greater than 0.6, and may, for example, be 0.7 or 0.75.

Just like the mirrors of the illumination optical unit 4, the mirrors Mi may have a highly reflective coating for the illumination radiation 16.

Figures 2, 3, 4:
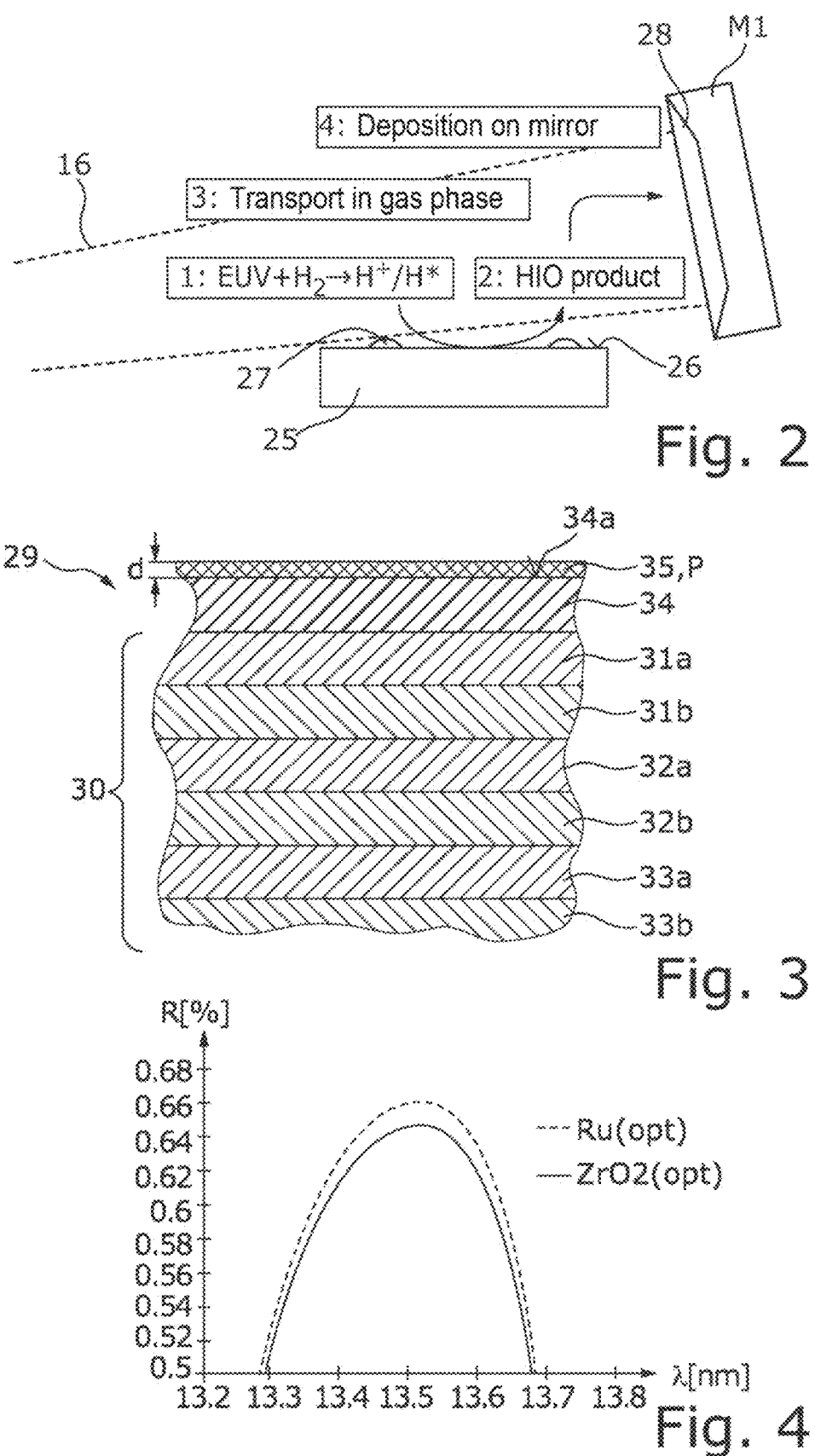

FIG. 2 shows a detail of the projection exposure apparatus 1 of FIG. 1 with the first mirror M1 of the projection optical unit 10 and with a mechanical component 25 disposed close to the first mirror M1. The mechanical component 25 may, for example, be an actuator, a sensor, a bearing and/or holding structure, a housing portion, etc. A surface 26 of the component 25 is close to the illumination radiation 16 that hits the first mirror M1. Accumulated on the surface 26 of the component are hydrogen-volatile contaminations 27 (HIO compounds), which may, for example, be phosphorus compounds, silicon compounds and/or zinc compounds. The hydrogen-volatile contaminations 27 may be deposited on the mirror M1 and form a contamination layer 28 on the surface of the mirror M1, which leads to a loss of reflectivity of the mirror M1. The contamination layer 28 in the example shown in FIG. 2 includes multiple HIO products.

The deposition of the contamination layer 28 on the mirror M1 can be effected in four steps (cf. also FIG. 2): In a first step, the illumination radiation 16 reacts with molecular hydrogen $H_2$ present in the environment of the first mirror M1 or in the entire projection optical unit 10 to give hydrogen ions $H^+$ or to give hydrogen radicals $H^*$, i.e. a hydrogen plasma is formed. In a second step, the hydrogen plasma, i.e. $H^+/H^*$, reacts with the hydrogen-volatile contaminants or the HIO elements 27 to give a volatile compound, typically to give a volatile hydride, which is identified as HIO product in FIG. 2. In a third step, the HIO product goes from the surface 26 of the component 25 to the surface of the first mirror M1. In a fourth step, the contamination layer 28 is formed there by reaction of the HIO product with the material of a cover layer, i.e. an uppermost layer, at the surface of the first mirror M1 to give a nonvolatile compound.

The formation of the contamination layer 28 on the first mirror M1 or on the mirrors Mi of the projection optical unit 10 and on the optical elements 19, 20, 22 of the illumination optical unit 4 in the course of operation of the projection exposure apparatus 1 leads to a loss of reflectivity of the respective optical elements Mi 19, 20, 22 and hence a loss of transmittance of the projection exposure apparatus 1. The loss of reflectivity dR/R is generally irreversible, meaning that the contamination layer 28 generally cannot be removed again easily by cleaning of the mirror M1.

FIG. 3 shows a cross section through the uppermost layers of a coating 29 applied to a substrate (not shown pictorially in FIG. 3) of the mirror M1. In the example shown, the mirror M1 is configured such that incident EUV radiation within a narrow spectral region around the operating wavelength of 13.5 nanometers is reflected with comparatively high reflectivity for a defined range of angles of incidence. For this purpose, the mirror M1 has a reflective coating 30. The reflective coating 30 is configured such that it acts as an interference layer system for the EUV radiation to be reflected.

For this purpose, the reflective coating 30 in the example shown takes the form of a multilayer coating having alternating layers 31*a*, 32*a*, 33*a* of a first layer material in the form of silicon and second layers 31*b*, 32*b*, 33*b* of a second layer material in the form of molybdenum. Different first and second layer materials, in the form of molybdenum and beryllium for example, are likewise possible, depending on the operating wavelength. By way of simplification of the diagram, FIG. 3 shows only the uppermost three twin layers of the reflective multilayer coating 30. Typically, a reflective multilayer coating 30, however, has between 50 and 100 twin layers.

A protective layer 34 formed from a metallic material, from a precious metal in the example shown, is applied atop the reflective multilayer coating 30. The protective layer 34 serves to protect layers 31*a*, 31*b*, 32*a*, 32*b*, 33*a*, 33*b* of the underlying reflective multilayer coating 30 from oxidation. In the example shown in FIG. 3, the protective layer 34 consists of ruthenium. It is alternatively possible that the protective layer 34 consists of a different (precious) metal, for example of rhodium, palladium or zirconium.

In the example shown in FIG. 3, a cover layer 35 is applied to the protective layer 34, which is intended to counteract the formation of the contamination layer 28 shown in FIG. 2. Cover layers 35 used, which form the uppermost layer of the coating 29, are frequently oxidic layers, for example layers of $SiO_2$, of $NbO_2$ or of $ZrO_2$. Although such a cover layer 35 of an oxidic material typically reduces the accumulation of HIO products or of the contamination layer 28 shown in FIG. 2, a cover layer 35 composed of such a material has comparatively high absorption for EUV radiation 16 and therefore leads to a comparatively large loss of reflectivity, as described hereinafter with reference to FIG. 4.

FIG. 4 shows two reflectivity progressions as a function of wavelength: the reflectivity R of mirror M1 with a protective layer 34 of ruthenium, without a cover layer 35 applied to the protective layer 34 and with a cover layer 35 of $ZrO_2$ applied to the surface 34*a* of the protective layer 34. As apparent in FIG. 4, the reflectivity R of mirror M1 at the working wavelength of 13.5 nm, because of the presence of the cover layer 35, decreases in absolute terms by about 1.8%, which, based on the maximum reflectivity R, corresponds to a reflectivity loss dR/R of about 2.7%. Although this reflectivity loss is lower than in the case that the contamination layer 28 described further above is deposited on the mirror M1, the reflectivity loss caused by the cover layer 35 is nevertheless comparatively large.

In order to reduce the reflectivity loss resulting from the presence of the cover layer 35, the coating 29 in the example shown in FIG. 3 has a cover layer 35 containing phosphorus P, more specifically consisting of phosphorus P, which is also referred to hereinafter as phosphorus cover layer 35. In spite of the fact that phosphorus is an HIO product, the application of the phosphorus cover layer 35 has been found to be favorable because phosphorus causes a comparatively low reflectivity loss dR/R of about 0.25% per nm of layer thickness d of the cover layer 35. In order that the cover layer 35 causes a comparatively small reflectivity loss, the thickness d of the cover layer 35 should typically be 2.5 nm or less. The cover layer 35 should additionally have a thickness d of at least 0.3 nm in order to establish sufficient coverage of the surface 34a of the protective layer 34 on which the cover layer 35 is deposited.

The cover layer 35 can be deposited in a coating chamber into which the mirror M1 is introduced before it is integrated into the projection exposure apparatus 1 of FIG. 1. The cover layer 35 in this case may be deposited, for example, by atomic layer deposition (ALD). The depositing of the cover layer 35 by atomic layer deposition is advantageous since the cover layer 35, in the case of such a deposition, even with the above-specified low thicknesses d, is continuous and stable and therefore capable of optimally fulfilling its function. The generation of the cover layer 35 by atomic layer deposition also allows comparatively precise adjustment of the thickness d of the cover layer 35 via a selection of the number of process cycles. By contrast with the cover layer 35, the protective layer 34 and the first and second layers 31a, 31b, 32a, 32b, 33a, 33b of the reflective multilayer coating 30 are typically each generated by physical gas phase deposition (PVD).

It has been found that a cover layer 35 consisting of phosphorus P or having a high proportion of phosphorus P of at least 95 at %, preferably of at least 98 at %, prevents or at least reduces the accumulation of HIO products other than phosphorus P in the form of the contamination layer 28 that has been described in association with FIG. 2. This is favorable because such HIO products or HIO elements, e.g. Si or Mg, cause a distinctly greater reflectivity loss dR/R than is the case for phosphorus P. The prevention of accumulation of other HIO elements exploits the fact that there is an (anti-) correlation between the HIO elements in the course of deposition, meaning that they influence one another in the course of deposition, in such a way that saturation of the cover layer 35 or the surface of the cover layer 35 with phosphorus P leads to a smaller proportion of deposited Si or $SiO_2$, or of Mg.

Figure 5:
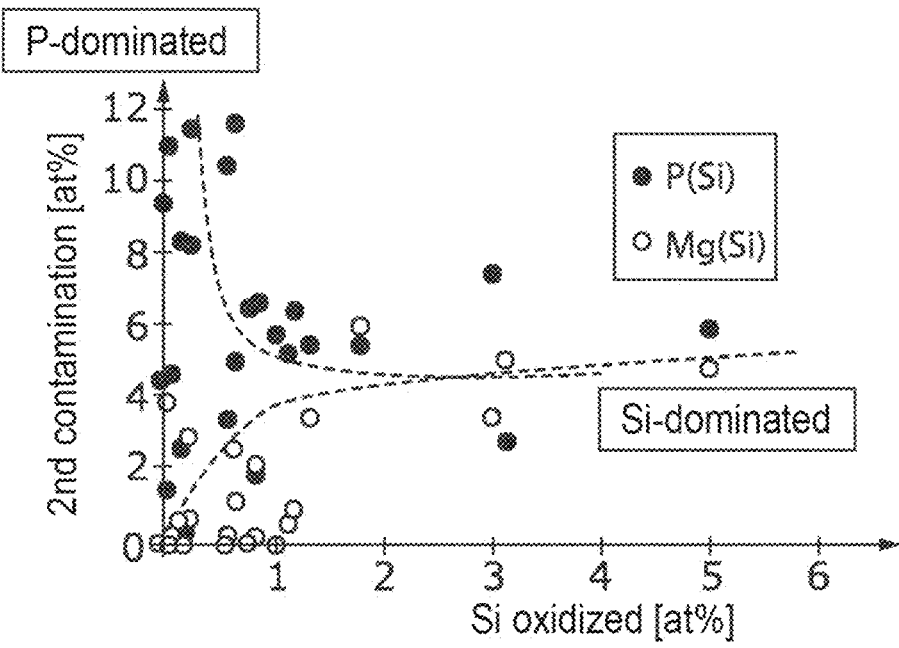

This correlation is apparent in the diagram shown in FIG. 5, in which the proportion of oxidized Si (in at %) is shown on the abscissa, and the proportion of the second contamination, i.e. of P or of Mg (in at %) on the ordinate. The dotted lines serve as a "guide to the eye" in order to be able to better follow the data progression. The measurement points were obtained by a chemical analysis of the surfaces of mirrors deinstalled after operation in a projection exposure apparatus 1. As apparent from FIG. 5, in the case of a concentration of P in the order of magnitude of more than about 5 at %, only a small amount of oxidized Si and Mg has accumulated at the surface. In the case of a cover layer 35 having a high phosphorus content, the proportion of the HIO elements Mg and Si accumulated on the surface of the cover layer 35, which are particularly unfavorable for reflectivity, is distinctly reduced.

As an alternative to the deposition of the cover layer 35 prior to the integration of the mirror M1 into the projection exposure apparatus 1, it is possible to deposit the cover layer 35 on the mirror M1 when integrated into a housing 36 of the projection exposure apparatus 1, as described hereinafter in connection with FIG. 6, which shows a detail of the projection exposure apparatus 1 of FIG. 1. A beam path 37 that emanates from the reticle 7 passes through the housing 36 in which the projection optical unit 10 of the projection exposure apparatus 1 is disposed, and through an opening 38 into an interior 39 of the housing 36. Within the interior 39 there exists a vacuum environment which is produced with the aid of vacuum pumps (not shown pictorially). There are six mirrors Mi disposed in the interior 39, of which FIG. 6 shows the first mirror M1 and the second mirror M2.

Figure 6:
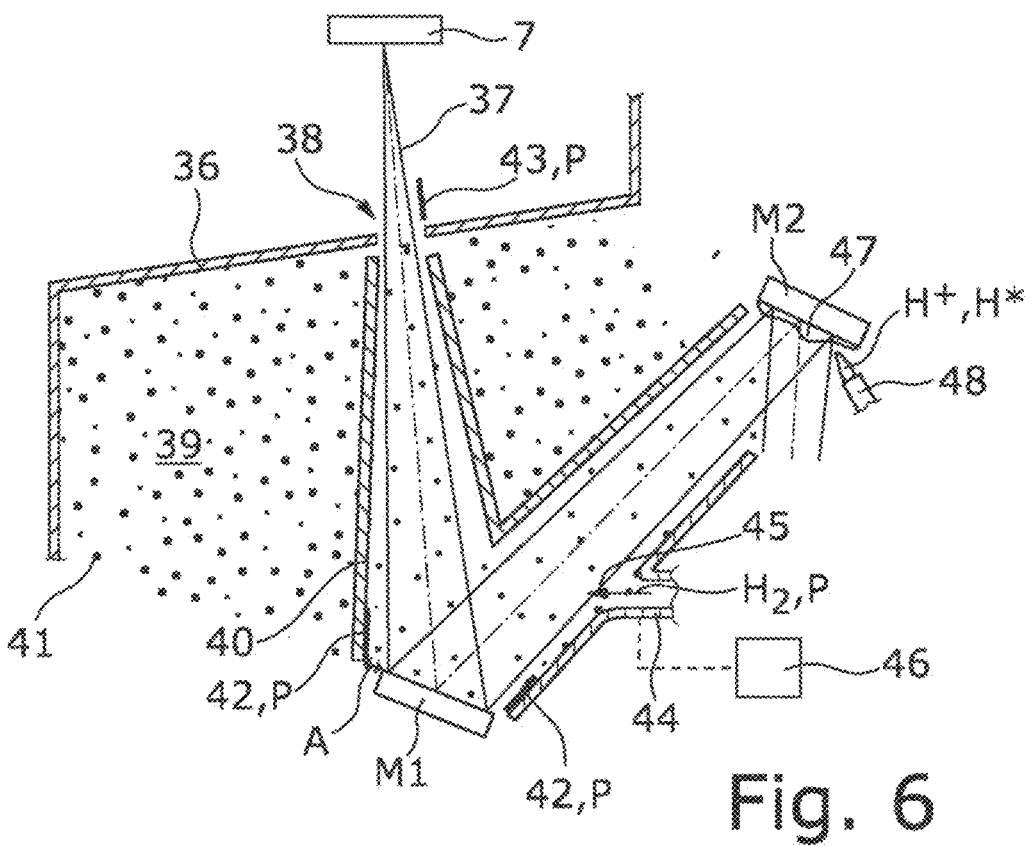

As likewise apparent in FIG. 6, there is a casing 40 disposed in the interior 39, which essentially surrounds or encapsulates the beam pathway 37 in the projection system 10, as described in U.S. Pat. No. 8,382,301 B2 or in U.S. Pat. No. 8,585,224 B2 for example, which are incorporated into this application in their entirety by reference. The casing 40 is a vacuum housing which is composed of multiple housing parts and consists essentially of stainless steel in the example shown. As likewise apparent in FIG. 6, the geometry of the casing 40 is matched to the geometry of the beam path 37, meaning that the geometry of the casing 40 follows the geometry of the beam path 37, meaning that the cross section thereof increases or decreases when the size of the cross section of the beam path 37 increases or decreases.

There are contaminating gaseous substances 41 in the interior 39 of the housing 36, which are indicated by dotted lines in FIG. 6. The contaminating gaseous substances 41 are the HIO elements or HIO products described further above, for example phosphorus-, zinc-, tin-, sulfur-, indium-, magnesium- or silicon-containing compounds. The volume within the casing 40 is typically purged with a purge gas, such that there is generally a smaller amount of contaminating gaseous substances 41 within the casing 40 than outside the casing 40.

Likewise shown in FIG. 6 is a phosphorus source 42 disposed on the inside of the casing 40 close to the first mirror M1. The phosphorus source 42 in the example shown is applied in the form of a phosphorous coating on the inside of the casing 40. The phosphorus source 42 in the form of the coating serves to provide the gaseous phosphorus required for the deposition of the phosphorus cover layer 35 described further above. The phosphorus P in the phosphorus source 42, in exposure operation of the projection exposure apparatus 1, is exposed to the hydrogen plasma $H^+$, $H^*$ described further above in association with FIG. 2, as a result of which the phosphorus P is released or outgassed and, in the manner described in association with FIG. 2, deposited on the surface of the mirror M1, in order to form the cover layer 35. The phosphorus source 42 in the form of the coating has a comparatively high thickness of greater than 1 mm in order to ensure that there is a sufficient reservoir of phosphorus P available throughout the lifetime of the projection exposure apparatus 1 to enable the deposition of the cover layer 35. The phosphorus source 42 in the form of the coating additionally has a phosphorus content of at least 95 at % or of at least 98 at %, in order to very substantially avoid contaminations by other outgassing substances.

The phosphorus source 42 in the form of the coating, in FIG. 6, is mounted at a distance A of less than 2 cm from the mirror M1, more specifically from the coating 29 on which the cover layer 35 is deposited. In the example shown in FIG. 6, the phosphorus source 42 in the form of the coating is applied on the inside of the casing 40 only in the vicinity of the mirror M1, but it will be apparent that the phosphorus source 42 in the form of the coating may also be applied to the entire inner face of the casing 40. It is likewise possible to arrange the one or, as the case may be, more than one phosphorus source on or at the mirror M1, for example at the lateral edge of the mirror M1 or of the mirror substrate in the vicinity of the lateral edge of the coating 29. It is favorable when the phosphorus source(s) is/are arranged around the mirror M1 such that the cover layer 35 is deposited with maximum homogeneity.

FIG. 6 likewise shows a (further) phosphorus source 43 disposed outside the housing 36 in the vicinity of the beam path 37 emanating from the reticle 7. The phosphorus source 43 is a component disposed in the projection exposure apparatus 1 exclusively for the purpose of providing the phosphorus P for the deposition of the cover layer 35. The phosphorus source 43 in the form of the additional component is a phosphorus-coated component, which is in sheet form in the example shown. The phosphorus coating of the phosphorus source 43 likewise has a thickness of at least 1 mm. Although the phosphorus source 43 is outside the interior 39, it is adjacent to the opening 38 in the housing 36, and so the phosphorus P released can enter the interior 39 of the housing 36 and be deposited on the mirrors M1 to M6 disposed in the interior 39.

As likewise apparent in FIG. 6, the projection exposure apparatus 1 has a gas inlet 44 via which the interior 39, more specifically the casing 40, is supplied with a gas 45 containing phosphorus P, for example in the form of phosphine, as indicated by an arrow. In the example shown, the gas 45 containing phosphorus P which is supplied to the interior 39 is mixed with a purge gas in the form of molecular hydrogen $H_2$. For the mixture, the gas 45 containing phosphorus P, which is present in a gas reservoir not shown pictorially, can be mixed with the molecular hydrogen $H_2$ in a mixing device. The phosphorus-containing gas 45 is not admixed constantly with the hydrogen $H_2$ in the example shown, but only for the duration of the deposition of the cover layer 35.

A programmable control device 46 that may take the form of hardware and/or software serves to actuate the gas inlet 44 or a valve provided therein, for example in the form of a mass flow regulator, in order to correspondingly control the supply of the gas 45 containing phosphorus P to the interior 39 by open-loop or closed-loop control. The partial pressure of the phosphorus P in the interior 39 is typically adjusted here to a value of $10^{-3}$ mbar or higher, for example to a value of $10^{-6}$ mbar. It will be apparent that multiple gas inlets 44 may be mounted in the projection exposure apparatus 1, which can supply the interior 39 with a gas containing phosphorus P at different positions. For example, one or a group of mirrors M1, . . . , M6 may each be assigned a gas inlet 44, disposed in the vicinity of a respective mirror M1, . . . , M6. By contrast with what is shown in FIG. 6, it is also possible for a respective gas inlet 44 to serve for supply of the gas 45 containing phosphorus P at a position within the interior 39 but outside the casing 40.

It is a prerequisite for the deposition of the cover layer 35 that the surface 34a of the protective layer 34 is free of impurities, and in particular has no carbon-containing contamination layer 47, as shown on the second mirror M2 in FIG. 6. In order to remove the carbon contamination layer 47 from the surface of the second mirror M2, it is possible to utilize the hydrogen plasma $H^+$, $H^*$ described further above in association with FIG. 2, which is generated in exposure operation.

For the removal of the carbon contamination layer 47, it is also possible to use a cleaning head 48 shown in FIG. 6, which generates a hydrogen plasma $H^+$, $H^*$. For this purpose, the cleaning head 48 may be designed, for example, as described in WO 2009/059614 A1 and may have, for example, a glow wire or another device in order to convert the molecular hydrogen $H_2$ to a hydrogen plasma $H^+$, $H^*$. The cleaning head 48 or, as the case may be, two or more cleaning heads may be activated with the aid of the control device 46 in order to remove the carbon contamination layer 47 before the cover layer 35 is deposited on the surface 34a of the second mirror M2. It will be apparent that the other mirrors M1, M3 to M6 of the projection system 10 may likewise be assigned one or more cleaning heads 48 in order to remove the carbon contamination layer 47.

A respective gas inlet 44 and the phosphorus sources 42, 43 may also be disposed elsewhere in the projection exposure apparatus 1 in order to provide the phosphorus P required for deposition of a cover layer 35 in the interiors of the corresponding housing of the illumination system 2, the light source 3 or a main housing that surrounds the illumination system 2 and the projection system 10. If the phosphorus source is disposed in the main housing outside the respective housing of the illumination system 2 or of the projection system 10, it is favorable when the corresponding phosphorus source is disposed close to an opening in the respective housing through which the beam path passes. It is also possible that a respective phosphorus source 43 is disposed close to a dynamic gas lock of the projection exposure apparatus 1 or elsewhere in the projection exposure apparatus 1.

What is claimed is:

1. A method, comprising:
depositing a cover layer containing phosphorus onto an optical element; wherein, in the course of said depositing of the cover layer, the optical element is disposed in an interior of a housing of an extreme ultraviolet (EUV) lithography system; and
for said depositing of the cover layer, releasing phosphorus from at least one phosphorus source disposed outside the interior or within the interior, wherein the cover layer is deposited onto a protective layer of the optical element.

2. The method as claimed in claim 1, wherein the cover layer has a phosphorus content of at least 95 at %.

3. The method as claimed in claim 1, wherein the cover layer has a thickness of between 0.3 nm and 5 nm.

4. The method as claimed in claim 1, wherein the protective layer includes at least one precious metal.

5. The method as claimed in claim 1, wherein said depositing of the cover layer comprises feeding at least one gas containing phosphorus to the interior via at least one gas inlet.

6. The method as claimed in claim 5, wherein said feeding of the gas containing phosphorus comprises admixing the gas with at least one purge gas.

7. The method as claimed in claim 6, wherein the purge gas is hydrogen.

8. The method as claimed in claim 5, wherein the phosphorus fed to the interior has a partial pressure in the interior of at least $10^{-6}$ mbar.

9. The method as claimed in claim 1, wherein said releasing of the phosphorus comprises exposing a source of the phosphorus to a hydrogen plasma which is generated in operation of the EUV lithography system.

10. The method as claimed in claim 1, further comprising:
removing a carbon contamination layer from a surface of the optical element prior to said depositing of the cover layer.

11. The method as claimed in claim 10, wherein the carbon contamination layer is removed from the surface by a hydrogen plasma generated in operation of the EUV lithography system.

12. The method as claimed in claim 10, wherein the carbon contamination layer is removed from the surface of the optical element by at least one cleaning head.

13. The method as claimed in claim 12, wherein the at least one cleaning head generates a hydrogen plasma.

14. A method, comprising:

depositing a cover layer containing phosphorus onto an optical element; wherein, in the course of said depositing of the cover layer, the optical element is disposed in an interior of a housing of an extreme ultraviolet (EUV) lithography system; and for said depositing of the cover layer, releasing phosphorus from at least one phosphorus source disposed outside the interior or within the interior, wherein said depositing of the cover layer comprises feeding at least one gas containing phosphorus to the interior via at least one gas inlet, and wherein said feeding of the gas containing phosphorus comprises admixing the gas with at least one purge gas.

15. The method as claimed in claim 14, wherein the purge gas is hydrogen.

16. The method as claimed in claim 15, wherein the phosphorus fed to the interior has a partial pressure in the interior of at least $10^{-6}$ mbar.

17. A method, comprising:

depositing a cover layer containing phosphorus onto an optical element; wherein, in the course of said depositing of the cover layer, the optical element is disposed in an interior of a housing of an extreme ultraviolet (EUV) lithography system; and for said depositing of the cover layer, releasing phosphorus from at least one phosphorus source disposed outside the interior or within the interior, wherein said releasing of the phosphorus comprises exposing a source of the phosphorus to a hydrogen plasma which is generated in operation of the EUV lithography system.

18. A method, comprising:

removing a carbon contamination layer from a surface of an optical element;

subsequent to the removing, depositing a cover layer containing phosphorus onto the optical element; wherein, in the course of said depositing of the cover layer, the optical element is disposed in an interior of a housing of an extreme ultraviolet (EUV) lithography system; and for said depositing of the cover layer, releasing phosphorus from at least one phosphorus source disposed outside the interior or within the interior.

19. The method as claimed in claim 18, wherein the carbon contamination layer is removed from the surface by a hydrogen plasma generated in operation of the EUV lithography system.

20. The method as claimed in claim 18, wherein the carbon contamination layer is removed from the surface of the optical element by at least one cleaning head.

21. The method as claimed in claim 20, wherein the at least one cleaning head generates a hydrogen plasma.

* * * * *